(12) United States Patent
Kim

(10) Patent No.: US 7,372,294 B2
(45) Date of Patent: May 13, 2008

(54) ON-DIE TERMINATION APPARATUS

(75) Inventor: Yong-Mi Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 152 days.

(21) Appl. No.: 11/478,084

(22) Filed: Jun. 30, 2006

(65) Prior Publication Data

US 2006/0255830 A1 Nov. 16, 2006

(30) Foreign Application Priority Data

Sep. 29, 2005 (KR) ............... 10-2005-0091657
Dec. 5, 2005 (KR) ............... 10-2005-0117640

(51) Int. Cl.
*H03K 19/003* (2006.01)

(52) U.S. Cl. ............... 326/30; 326/16
(58) Field of Classification Search ......... 326/16, 326/30
See application file for complete search history.

(56) References Cited

U.S. PATENT DOCUMENTS

| | | | | |
|---|---|---|---|---|
| 5,285,119 | A * | 2/1994 | Takahashi | 326/57 |
| 6,337,819 | B1 | 1/2002 | Shinozaki | |
| 6,809,546 | B2 | 10/2004 | Song et al. | |
| 6,924,660 | B2 | 8/2005 | Nguyen et al. | |
| 7,019,553 | B2 * | 3/2006 | Blodgett et al. | 326/30 |
| 7,285,979 | B2 * | 10/2007 | Janzen et al. | 326/30 |
| 2004/0100837 | A1 | 5/2004 | Lee | |
| 2004/0141391 | A1 | 7/2004 | Lee et al. | |
| 2004/0218434 | A1 | 11/2004 | Hwang et al. | |
| 2005/0225353 | A1 | 10/2005 | Kwon | |
| 2005/0253615 | A1 | 11/2005 | Sunwoo et al. | |

FOREIGN PATENT DOCUMENTS

| | | |
|---|---|---|
| JP | 2004-310981 | 11/2004 |
| KR | 2003-0090955 A | 12/2003 |
| KR | 10-2004-0055879 A | 6/2004 |

OTHER PUBLICATIONS

Korean Office Action issued in corresponding Korean Patent Application No. KR. 2005-0117640, dated Oct. 31, 2006.

* cited by examiner

*Primary Examiner*—James H. Cho
(74) *Attorney, Agent, or Firm*—McDermott Will & Emery LLP

(57) ABSTRACT

An on-die termination apparatus guarantees a desirable spec margin by separately controlling pull-up transistors and pull-down transistors provided in a main on-die termination block. The on-die termination circuit includes an extended mode register set decoding unit for decoding an inputted address to output a plurality of decoding signals to set a termination impedance; an ODT control unit for selectively activating a plurality of pull-up control signals and a multiplicity of pull-down control signals by logically combining the plurality of decoding signals, pull-up test signals and pull-down test signals; and an ODT unit including a plurality of main termination units to test the termination impedance by separately activating the plurality of main termination units based on the plurality of pull-up control signals and the multiplicity of pull-down control signals.

19 Claims, 4 Drawing Sheets

ON-DIE TERMINATION APPARATUS

TECHNICAL FIELD

The present invention relates to an on-die termination apparatus; and, more particularly, to an on-die termination apparatus for guaranteeing a desirable spec margin by separately controlling pull-up transistors and pull-down transistors provided in a main on-die termination block.

BACKGROUND

Recently, various new technologies have been developed for improving a data transferring speed of a double data rate (DDR) memory device. For instance, an off chip driver (OCD) calibration technology has been introduced to a specification of the DDR memory device by the JEDEC (Joint Electron Engineering Council) in order to adjust an impedance of a data output unit of the DDR memory device.

That is, the optimum impedance of a data output driver for a current system is detected by measuring a voltage, or a current which flows from an external circuit such as a chip set to the data output driver, so that an impedance of the data output driver is adjusted to the optimum impedance. For this purpose, a DDR2 synchronous semiconductor memory device additionally includes an OCD control unit for adjusting an impedance of the data output driver.

A termination impedance is needed for stably transferring a signal between circuits. If the termination impedance is not appropriately matched, a signal reflection error can occur, i.e., a transferred signal can be reflected back. However, if an external fixed resistor is provided, an appropriate matching may not be obtained due to aging of an integrated circuit, temperature variations or manufacturing process variations.

Therefore, a technology for adjusting the termination impedance has been developed in order to obtain an impedance match with an external reference impedance by controlling the number of turned-on transistors among a plurality of transistors connected in parallel.

FIG. 1 is a block diagram showing a conventional on-die termination (ODT) control device.

As shown, the conventional ODT control device includes first to third driving control units 10, 20 and 30.

The first driving control unit 10 includes a first inverter I1, first and second PMOS transistors P1 and P2, and first and second NMOS transistors N1 and N2. The first PMOS transistor P1 and the first NMOS transistor N1, connected in series between a source voltage and a ground voltage, have a common gate for receiving a first decoding signal S0 and a common drain for outputting a first pull-up control signal PU_S0. The second PMOS transistor P2 and the second NMOS transistor N2, connected in series between the source voltage and the ground voltage, have a common gate for receiving an inverted first decoding signal and a common drain for outputting a first pull-down control signal PD_S0.

The second driving control unit 20 includes a second inverter I2, third and fourth PMOS transistors P3 and P4, and third and fourth NMOS transistors N3 and N4. The third PMOS transistor P3 and the third NMOS transistor N3, connected in series between the source voltage and the ground voltage, have a common gate for receiving a second decoding signal S1 and a common drain for outputting a second pull-up control signal PU_S1. The fourth PMOS transistor P4 and the fourth NMOS transistor N4, connected in series between the source voltage and the ground voltage, have a common gate for receiving an inverted second decoding signal and a common drain for outputting a second pull-down control signal PD_S1.

The third driving control unit 30 includes a third inverter I3, fifth and sixth PMOS transistors P5 and P6, and fifth and sixth NMOS transistors N5 and N6. The fifth PMOS transistor P5 and the fifth NMOS transistor N5, connected in series between the source voltage and the ground voltage, have a common gate for receiving a third decoding signal S2 and a common drain for outputting a third pull-up control signal PU_S2. The sixth PMOS transistor P6 and the sixth NMOS transistor N6, connected in series between the source voltage and the ground voltage, have a common gate for receiving an inverted third decoding signal and a common drain for outputting a third pull-down control signal PD_S2.

In the conventional ODT control device including the first to the third driving control units 10 to 30, if the first decoding signal S0 is a logic level 'HIGH', a termination impedance becomes 150Ω. If the first and the second decoding signals S1 and S2 are a logic level 'HIGH', the termination impedance becomes 75Ω. If all of the first to the third decoding signals S1 to S3 are a logic level 'HIGH', the termination impedance becomes 50Ω.

The conventional ODT control device further includes an ODT block (not shown) having a plurality of main termination units whose PMOS transistors and NMOS transistors are simultaneously turned on or off. Accordingly, in the conventional ODT control device, it is possible to adjust the termination impedance by controlling a pull-up impedance and a pull-down impedance of each PMOS transistor and each NMOS transistor provided in the plural main termination units based on the first to the third pull-up control signals PU_S0 to PU_S2, and the first to the third pull-down control signals PD_S0 to PD_S2.

However, during adjusting the termination impedance, the termination impedance is varied because the pull-up impedance and the pull-down impedance are varied according to other PMOS transistors or NMOS transistors which are simultaneously turned on or off. Accordingly, it is difficult to accurately detect an error occurring in the pull-up impedance of the PMOS transistors and the pull-down impedance of the NMOS transistors.

In addition, when there are changes in process, voltage and temperature, the PMOS transistors and the NMOS transistors exhibit different physical properties. As a result, operation of the PMOS transistors and the NMOS transistors should be appropriately varied according to the process, the voltage and the temperature. However, in the conventional ODT control device, it is difficult to test the operation so as to modify the termination impedance as intended.

SUMMARY OF THE INVENTION

It is, therefore, an object of the present invention to provide an on-die termination apparatus for guaranteeing a desirable spec margin by separately controlling pull-up transistors and pull-down transistors provided in an ODT block.

It is, therefore, another object of the present invention to provide an on-die termination apparatus for detecting an error occurring in the pull-up impedance of the PMOS transistors and the pull-down impedance of the NMOS transistors.

In accordance with an aspect of the present invention, there is provided an on die termination (ODT) apparatus, including: an extended mode register set decoding unit for decoding an inputted address and outputting a plurality of decoding signals to set a termination impedance; an ODT control unit for selectively activating a plurality of pull-up control signals and a multiplicity of pull-down control signals by logically combining the plurality of decoding signals, pull-up test signals and pull-down test signals; and an ODT unit including a plurality of main termination units to test the termination impedance by separately activating the plurality of main termination units based on the plurality of pull-up control signals and the multiplicity of pull-down control signals.

In accordance with another aspect of the present invention, there is provided a semiconductor memory device, including: an extended mode register set decoding unit for decoding an inputted address and outputting a plurality of decoding signals to set a termination impedance; an ODT control unit for selectively activating a plurality of pull-up control signals and a multiplicity of pull-down control signals by logically combining the plurality of decoding signals, pull-up test signals and pull-down test signals; and an ODT unit including a plurality of main termination units, each main termination unit having a PMOS driving unit and an NMOS driving unit to test the termination impedance by separately activating the plurality of main termination units based on the plurality of pull-up control signals and the multiplicity of pull-down control signals.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor memory device with an on-die termination apparatus in accordance with a preferred embodiment of the present invention will be described in detail with reference to the accompanying drawings.

Figure 1:
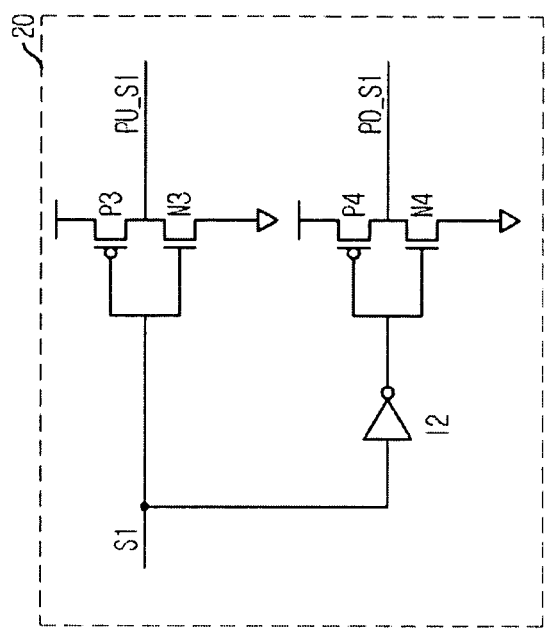
FIG. 1 is a block diagram showing a conventional on-die-termination (ODT) control device.
Figure 1:
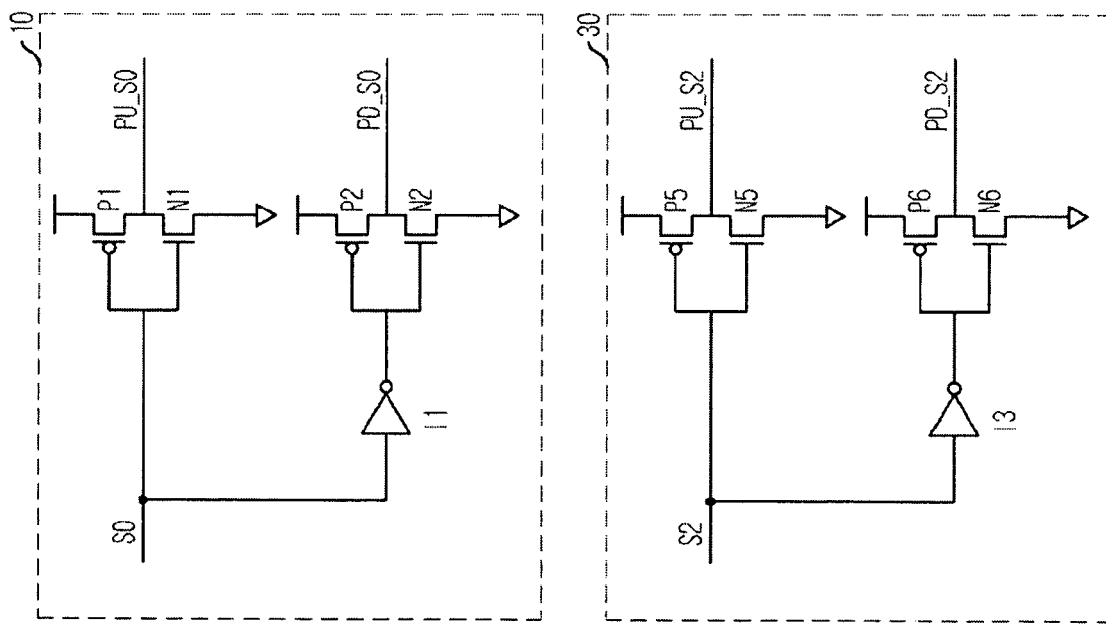
Figure 2:
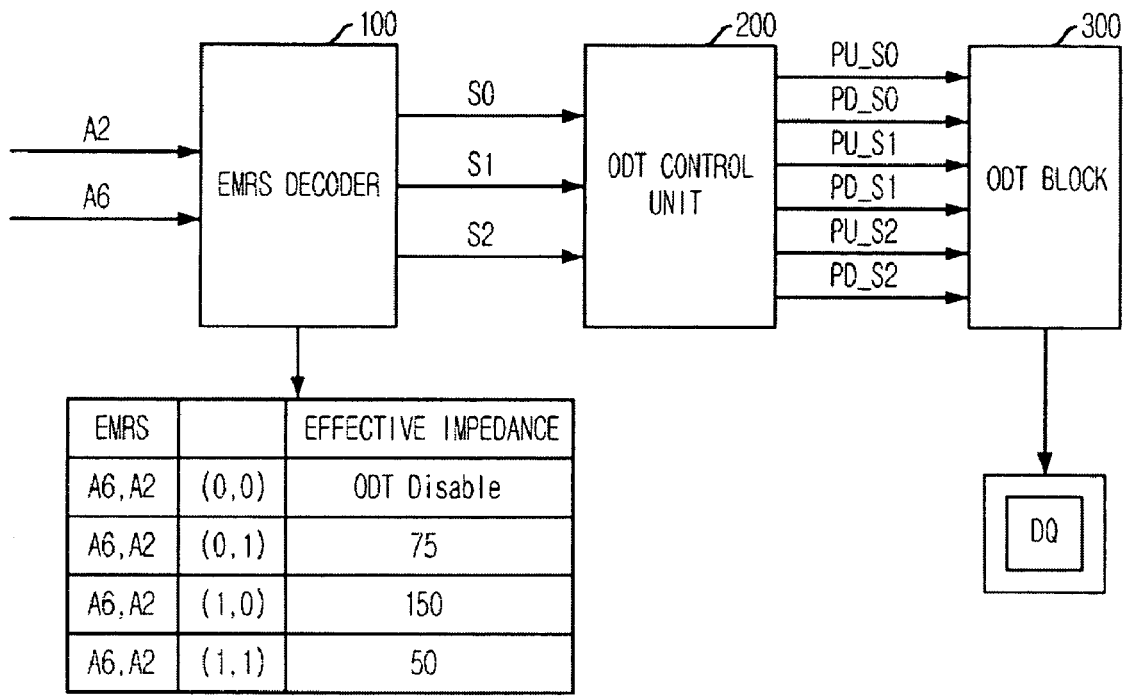
FIG. 2 is a block diagram showing an ODT apparatus in accordance with an embodiment of the present invention.

FIG. 2 is a block diagram showing an ODT apparatus in accordance with an embodiment of the present invention.

As shown, the on-die termination (ODT) apparatus includes an extended mode register set (EMRS) decoder 100, an ODT control unit 200 and an ODT block 300.

The EMRS decoder 100 decodes first and second input addresses A2 and A6 for setting an EMRS code to thereby output first to third decoding signals S0, S1, and S2.

The ODT control unit 200 outputs first to third pull-up control signals PU_S0, PU_S1 and PU_S2 based on the first to the third decoding signals S0, S1, and S2 outputted from the EMRS decoder 100. Herein, the first to third pull-up control signals PU_S0, PU_S1 and PU_S2 are for separately testing each of pull-up impedances of PMOS transistors. The ODT control unit 200 also outputs first to third pull-down control signals PD_S0, PD_S1 and PD_S2 based on the first to third decoding signals S0, S1, and S2. Herein, the first to third pull-down control signals PD_S0, PD_S1 and PD_S2 are for separately testing each of pull-down impedances of NMOS transistors.

The ODT block 300 adjusts the pull-up impedance and the pull-down impedance so as to output an adjusted impedance value to an output data pad DQ, in response to the first to third pull-up control signals PU_S0, PU_S1 and PU_S2, and the first to third pull-down control signals PD_S0, PD_S1 and PD_S2.

Figure 3:
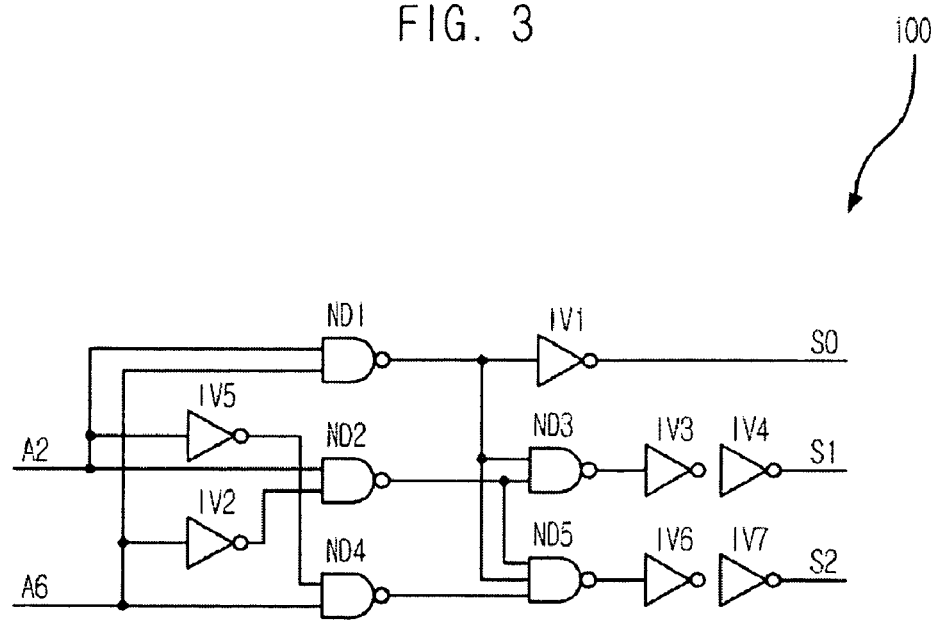
FIG. 3 is a detailed circuit diagram depicting an EMRS decoder shown in FIG. 2.

FIG. 3 is a detailed circuit diagram depicting the EMRS decoder 100 shown in FIG. 2.

As shown, the EMRS decoder 100 includes first to seventh inverters IV1 to IV7, and first to fifth NAND gates ND1 to ND5.

The first NAND gate ND1 performs a NAND operation of the first and the second input addresses A2 and A6. The first inverter IV1 inverts an output of the first NAND gate ND1 so as to output the first decoding signal S0.

The second NAND gate ND2 performs a NAND operation of the first input address A2 and an inverted second input address inverted by the second inverter IV2. The third NAND gate ND3 performs a NAND operation of outputs of the first and the second NAND gates ND1 and ND2. The third and the fourth inverter IV3 and IV4 delay an output of the third NAND gate ND3 without inverting to thereby output the second decoding signal S1.

The fourth NAND gate ND4 performs a NAND operation of the second input address A6 and an inverted first input address inverted by the fifth inverter IV5. The fifth NAND gate ND5 performs a NAND operation of outputs of the first, the second and the fourth NAND gates ND1, ND2 and ND4. The sixth and the seventh inverter IV6 and IV7 delay an output of the fifth NAND gate ND5 without inverting to thereby output the third decoding signal S2.

Figure 4:
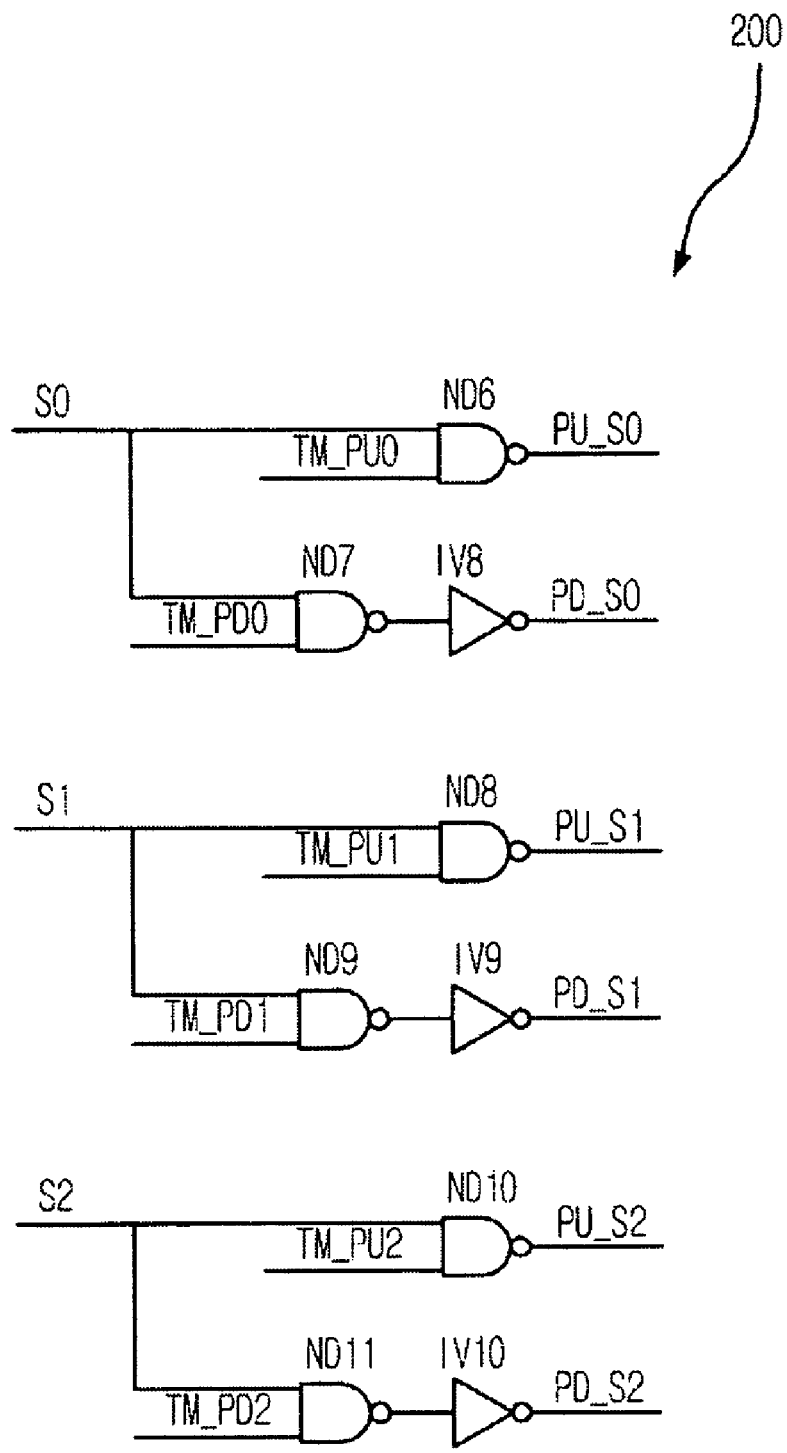
FIG. 4 is a detailed circuit diagram depicting an ODT control unit shown in FIG. 2.

FIG. 4 is a detailed circuit diagram depicting the ODT control unit 200 shown in FIG. 2.

As shown, the ODT control unit 200 includes first to third inverters IV8 to IV10, and first to sixth NAND gates ND6 to ND11.

The first NAND gate ND6 performs a NAND operation of the first decoding signal S0 and a first pull-up test signal TM_PU0 to output the first pull-up control signal PU_S0. The second NAND gate ND7 performs a NAND operation of the first decoding signal S0 and a first pull-down test signal TM_PD0. The first inverter IV8 inverts an output of the second NAND gate ND7 to output the first pull-down control signal PD_S0.

The third NAND gate ND8 performs a NAND operation of the second decoding signal S1 and a second pull-up test signal TM_PU1 to output the second pull-up control signal PU_S1. The fourth NAND gate ND9 performs a NAND operation of the second decoding signal S1 and a second pull-down test signal TM_PD1. The second inverter IV9 inverts an output of the fourth NAND gate ND9 to output the second pull-down control signal PD_S1.

Likewise, the fifth NAND gate ND10 performs a NAND operation of the third decoding signal S2 and a third pull-up test signal TM_PU2 to output the third pull-up control signal PU_S2. The sixth NAND gate ND11 performs a NAND operation of the third decoding signal S2 and a third pull-down test signal TM_PD2. The third inverter IV10 inverts an output of the sixth NAND gate ND11 to output the third pull-down control signal PD_S2.

Figure 5:
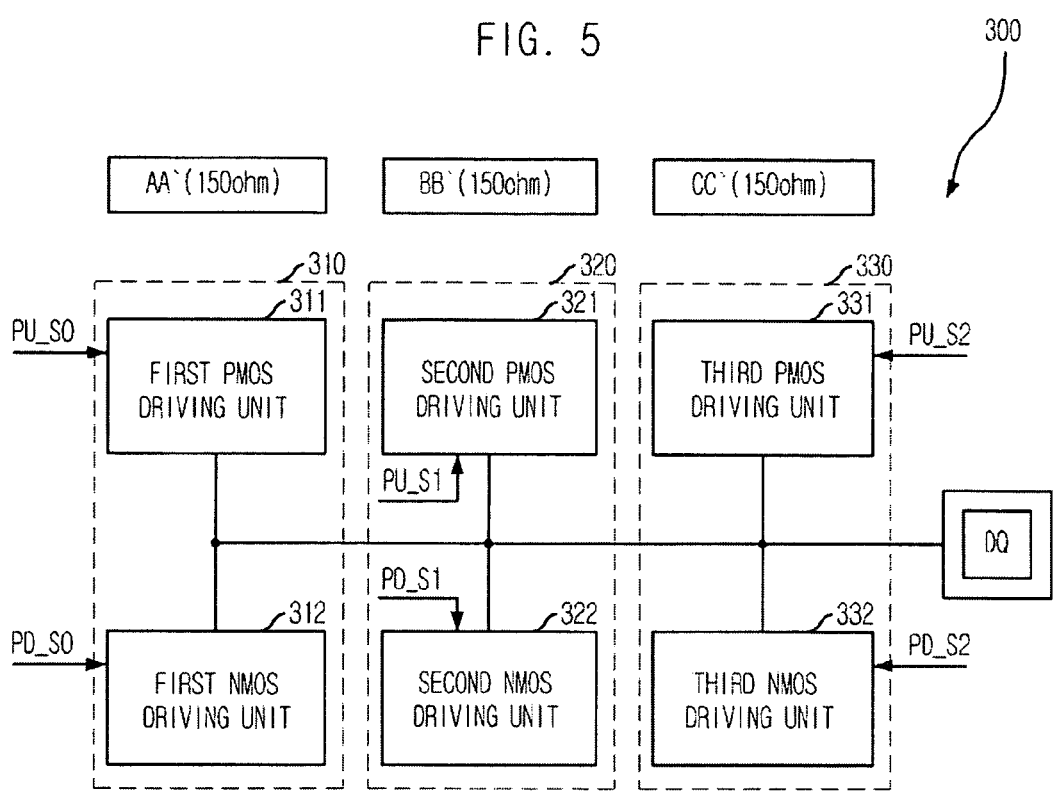
FIG. 5 is a block diagram depicting an ODT block illustrated in FIG. 2.

FIG. 5 is a block diagram depicting the ODT block 300 illustrated in FIG. 2.

As shown, the ODT block 300 includes first to third main termination units 310, 320 and 330.

The first main termination unit 310 includes a first PMOS driving unit 311 operated by the first pull-up control signal PU_S0 and a first NMOS driving unit 312 operated by the first pull-down control signal PD_S0.

The second main termination unit 320 includes a second PMOS driving unit 321 operated by the second pull-up control signal PU_S1 and a second NMOS driving unit 322 operated by the second pull-down control signal PD_S1.

The third main termination unit 330 includes a third PMOS driving unit 331 operated by the third pull-up control signal PU_S2 and a third NMOS driving unit 332 operated by the third pull-down control signal PD_S2.

Figure 6:
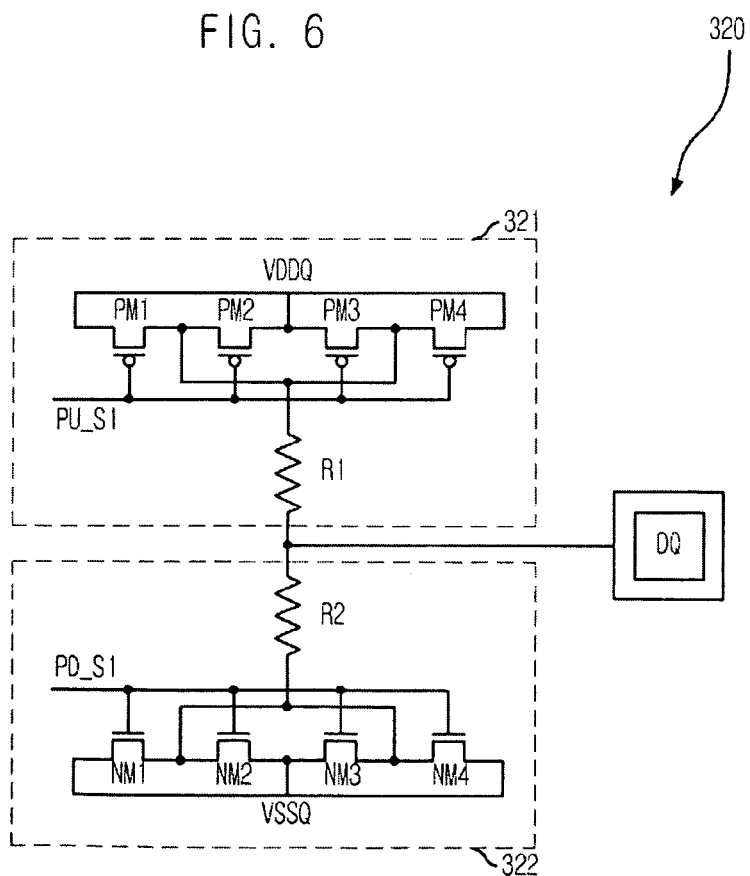
FIG. 6 is detailed circuit diagram describing a main termination unit shown in FIG. 5.

FIG. 6 is detailed circuit diagram describing the second main termination unit 320 shown in FIG. 5.

Herein, the first and the third main termination units 310 and 330 have the same circuit structure as the second main termination unit 320, and thus, the second main termination unit 320 will be described as an exemplary structure.

As shown, the second main termination unit 320 includes the second PMOS driving unit 321 and the second NMOS driving unit 322.

The second PMOS driving unit 321 includes a plurality of PMOS transistors, i.e., PM1, PM2, PM3 and PM4, and a first termination resistor R1. The plurality of PMOS transistors PM1 to PM4 are connected between a source voltage terminal VDDQ and one terminal of the first termination resistor R1 in parallel. Each gate of the plural PMOS transistors PM1 to PM4 receives the second pull-up control signal PU_S1. The first termination resistor R1 has the other terminal coupled to the output data pad DQ.

The second NMOS driving unit 322 includes a plurality of NMOS transistors, i.e., NM1, NM2, NM3 and NM4, and a second termination resistor R2. The plurality of NMOS transistors NM1 to NM4 are connected between a ground voltage terminal VSSQ and one terminal of the second termination resistor R2 in parallel. Each gate of the plural NMOS transistors NM1 to NM4 receives the second pull-down control signal PD_S1. The second termination resistor R2 has the other terminal coupled to the output data pad DQ.

Hereinafter, referring to FIGS. 2 to 6, an operation for setting a termination impedance of the ODT apparatus will be described.

A double data rate 2 (DDR2) SDRAM uses an effective impedance proposed by its own specification as the termination impedance. The effective impedance can be set to 50Ω, 75Ω or 100Ω according to the EMRS code generated by the EMRS decoder 100. The EMRS decoder 100 outputs the first to the third decoding signals S0, S1, and S2 based on the effective impedance. Herein, the effective impedance can be adjusted by using the first and the second input addresses A2 and A6.

If both of the first and the second input addresses A2 and A6 are a logic level 'LOW', the EMRS decoder 100 sets the ODT apparatus to an ODT disable mode. If the first input address A2 is a logic level 'HIGH' and the second input address A6 is a logic level 'LOW', the EMRS decoder 100 sets the effective impedance to be 75Ω. If the first input address A2 is a logic level 'LOW' and the second input address A6 is a logic level 'HIGH', the EMRS decoder 100 sets the effective impedance to be 150Ω. If both of the first and the second input addresses A2 and A6 are a logic level 'HIGH', the EMRS decoder 100 sets the effective impedance to be 50Ω.

When all of the first to the third decoding signals S0, S1, and S2 are activated, the ODT control unit 200 selectively activates the first to the third pull-up control signals PU_S0 to PU_S2, and the first to the third pull-down control signals PD_S0 to PD_S2 in response to the first to the third pull-up test signals TM_PU0 to TM_PU2, and the first to the third pull-down test signals TM_PD0 to TM_PD2.

That is, in the present invention, it is possible to separately control the first to the third PMOS driving units 311, 321 and 331, and the first to the third NMOS driving units 312, 322 and 332 provided in the first to the third main termination units 310, 320 and 330 in response to the first to the third pull-up test signals TM_PU0 to TM_PU2, and the first to the third pull-down test signals TM_PD0 to TM_PD2.

If the pull-up impedance is large or small, the first to the third PMOS driving units 311, 321 and 331 can be adjusted. Likewise, if the pull-down impedance is large or small, the first to the third NMOS driving units 312, 322 and 332 can be adjusted. As a result, it is possible to guarantee a desirable spec margin of the effective impedance proposed by the specification.

For example, it is assumed that each of the first to third PMOS driving units 311, 321 and 331 has a turned-on impedance value of approximately 150Ω, and each of the first to third NMOS driving units 312, 322 and 332 has a turned-on impedance value of approximately 150Ω. Therefore, it is possible to set the termination impedance to be approximately 150Ω by turning-on only one of the first to third main termination units 310, 320 and 330. In addition, it is possible to set the termination impedance to be approximately 75Ω by turning-on two of the first to third main termination units 310, 320 and 330. Likewise, it is possible to set the termination impedance to be approximately 50Ω by turning-on all of the first to third main termination units 310, 320 and 330.

When the second pull-up test signal TM_PU1 is activated with a logic level 'HIGH', both of the second pull-up control signal PU_µL and the second pull-down control signal PD_S1 are a logic level 'LOW'. Accordingly, the second NMOS driving unit 322 maintains a turned-off state and the second PMOS driving unit 321 is turned on. As a result, it is possible to measure a current flowing on the second PMOS driving unit 321 via the output data pad DQ.

When the second pull-down test signal TM_PD1 is activated with a logic level 'HIGH', the second pull-up control signal PU_S1 and the second pull-down control signal PD_S1 are a logic level 'HIGH'. Accordingly, the second PMOS driving unit 321 maintains a turned-off state and the second NMOS driving unit 322 is turned on. As a result, it is possible to measure a current flowing on the second NMOS driving unit 322 via the output data pad DQ.

As described above, in the present invention, it is possible to measure a current of each driving unit or test characteristics of PMOS transistors and NMOS transistors by separately turning-on or turning-off the PMOS driving units and the NMOS driving units in response to the pull-up test signals and the pull-down test signals.

Further, in the present invention, it is possible to control the effective impedance of the main termination units and a mismatch of the termination impedance, thereby improving reliability of the on-die termination circuit.

The present application contains subject matter related to the Korean patent application Nos. KR 2005-91657 & 2005-0117640, filed in the Korean Patent Office on Sep. 29, 2005 & Dec. 5, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An on die termination (ODT) apparatus, comprising:
   an extended mode register set decoding unit for decoding an inputted address and outputting a plurality of decoding signals to set a termination impedance;
   an ODT control unit for selectively activating a plurality of pull-up control signals and a multiplicity of pull-down control signals by logically combining the plurality of decoding signals, pull-up test signals and pull-down test signals; and
   an ODT unit including a plurality of main termination units to test the termination impedance by separately activating the plurality of main termination units based on the plurality of pull-up control signals and the multiplicity of pull-down control signals.

2. The ODT apparatus as recited in claim 1, wherein each main termination unit includes a PMOS driving unit and an NMOS driving unit.

3. The ODT apparatus as recited in claim 2, wherein the PMOS driving unit and the NMOS driving unit in said each main termination unit are set to have the same impedance value.

4. The ODT apparatus as recited in claim 2, wherein the number of the plurality of pull-up control signals is the same as that of PMOS driving units in the plurality of main termination units.

5. The ODT apparatus as recited in claim 4, wherein each of the PMOS driving units includes:
   a plurality of PMOS transistors having terminals connected to a first source voltage terminal and gates for receiving a corresponding one of the pull-up control signals; and
   a first termination resistor connected between other terminals of the plurality of PMOS transistors and an output data pad.

6. The ODT apparatus as recited in claim 2, wherein the number of the pull-down control signals is the same as that of NMOS driving units in the plurality of main termination units.

7. The ODT apparatus as recited in claim 6, wherein each of the NMOS driving units includes:
   a plurality of NMOS transistors having terminals connected to a second source voltage terminal and gates for receiving a corresponding one of the pull-down control signals; and
   a second termination resistor connected between other terminals of the plurality of NMOS transistors and an output data pad.

8. The ODT apparatus as recited in claim 1, wherein the ODT control unit selectively activates the plurality of pull-up control signals when the pull-up test signals are activated, and selectively activates the multiplicity of pull-down control signals when the pull-down test signals are activated.

9. The ODT apparatus as recited in claim 1, wherein the ODT control unit includes:
   a plurality of first logic gates for outputting the plurality of pull-up control signals by logically combining the plurality of decoding signals and the pull-up test signals;
   a plurality of second logic gates for logically combining the plurality of decoding signals and the pull-down test signals; and
   a plurality of inverters for inverting outputs of the plurality of second logic gates and outputting the inverted signals as the multiplicity of pull-down control signals.

10. The ODT apparatus as recited in claim 9, wherein each of the first logic gates includes a NAND gate.

11. The ODT apparatus as recited in claim 9, wherein each of the second logic gates includes a NAND gate.

12. A semiconductor memory device, comprising:
   an extended mode register set decoding unit for decoding an inputted address and outputting a plurality of decoding signals to set a termination impedance;
   an ODT control unit for selectively activating a plurality of pull-up control signals and a multiplicity of pull-down control signals by logically combining the plurality of decoding signals, pull-up test signals and pull-down test signals; and
   an ODT unit including a plurality of main termination units, each main termination unit having a PMOS driving unit and an NMOS driving unit to test the termination impedance by separately activating the plurality of main termination units based on the plurality of pull-up control signals and the multiplicity of pull-down control signals.

13. The semiconductor memory device as recited in claim 12, wherein the PMOS driving unit and the NMOS driving unit of said each main termination unit are set to have the same impedance value.

14. The semiconductor memory device as recited in claim 12, wherein the number of the plurality of pull-up control signals is the same as that of the PMOS driving units in the plurality of main termination units.

15. The semiconductor memory device as recited in claim 14, wherein each of the PMOS driving units includes:
   a plurality of PMOS transistors having terminals connected to a first source voltage terminal and gates for receiving a corresponding one of the pull-up control signals; and
   a first termination resistor connected between other terminals of the plurality of PMOS transistors and an output data pad.

16. The semiconductor memory device as recited in claim 12, wherein the number of the pull-down control signals is the same as that of NMOS driving units in the plurality of main termination units.

17. The semiconductor memory device as recited in claim 16, wherein each of the NMOS driving units includes:
   a plurality of NMOS transistors, each NMOS transistor having one terminals connected to a second source voltage terminal and gates for receiving a corresponding one of the pull-down control signals; and
   a second termination resistor connected between the other terminals of the plurality of NMOS transistors and an output data pad.

18. The semiconductor memory device as recited in claim 12, wherein the ODT control unit selectively activates the plurality of pull-up control signals when the pull-up test signals are activated, and selectively activates the plurality of pull-down control signals when the pull-down test signals are activated.

19. The semiconductor memory device as recited in claim 12, wherein the ODT control unit includes:
   a plurality of first NAND gates for outputting the plurality of pull-up control signals by logically combining the plurality of decoding signals and the pull-up test signals;
   a plurality of second NAND gates for logically combining the plurality of decoding signals and the pull-down test signals; and
   a plurality of inverters for inverting outputs of the plurality of second NAND gates and outputting the inverted signals as the multiplicity of pull-down control signals.

* * * * *